United States Patent [19]

Cottrell et al.

[11] Patent Number: 4,675,559
[45] Date of Patent: Jun. 23, 1987

[54] DIFFERENTIAL CIRCUIT HAVING A HIGH VOLTAGE SWITCH

[75] Inventors: Peter E. Cottrell, Essex Junction; John E. Gersbach; Wilbur D. Pricer, both of Burlington, all of Vt.

[73] Assignee: International Business Machines Corporation, Armonk, N.Y.

[21] Appl. No.: 628,878

[22] Filed: Jul. 9, 1984

Related U.S. Application Data

[62] Division of Ser. No. 332,403, Dec. 21, 1981, Pat. No. 4,477,846.

[51] Int. Cl.⁴ .................. H03K 17/16; H03K 19/003
[52] U.S. Cl. .................................... 307/530; 307/355; 307/255; 307/494; 330/252; 330/261; 365/208; 360/68
[58] Field of Search .............. 307/530, 355, 313, 255, 307/494; 330/252, 261; 360/46, 68; 365/207, 208

[56] References Cited

U.S. PATENT DOCUMENTS

| | | | |
|---|---|---|---|
| 3,660,679 | 5/1972 | Ishigaki et al. | 330/252 X |
| 3,685,025 | 8/1972 | Bryant et al. | 340/173 FF |
| 3,840,756 | 10/1974 | Jones | 307/264 |
| 4,099,266 | 7/1978 | Biggers | 365/208 |
| 4,131,809 | 12/1978 | Baars | 330/261 X |
| 4,180,780 | 12/1979 | Rumbaugh | 330/252 |
| 4,249,219 | 2/1981 | Aoi et al. | 360/46 |
| 4,371,900 | 2/1983 | Huber | 360/46 X |

FOREIGN PATENT DOCUMENTS

| | | | |
|---|---|---|---|
| 121718 | 9/1979 | Japan | 360/68 |
| 77015 | 6/1980 | Japan | 360/46 |

OTHER PUBLICATIONS

Millman et al, *Electronic Devices and Circuits*; p. 247-251; McGraw-Hill Co. 1967.
Poppelbaum, *Electronics* (pub.); p. 108; 4/4/1967.
K. G. Tertel, IBM Technical Disclosure Bulletin, vol. 13, No. 2, Jul. 1970, pp. 484-485, "Differential Amplifier".
B. C. Atwood, IBM Technical Disclosure Bulletin, vol. 17, No. 9, Feb. 1975, "Symmetrical Low-Offset Transistor", p. 2574.

*Primary Examiner*—John S. Heyman
*Attorney, Agent, or Firm*—Stephen J. Limanek

[57] ABSTRACT

This invention provides a differential circuit having first and second transistors interconnected by a third transistor which is symmetrically constructed. A current source is selectively connected to the base of the third transistor. When the current source is connected to the base of the third transistor, the third transistor is saturated, forming a very low impedance path between the first and second transistors. However, when the current source is disconnected from the base of the third transistor, the third transistor impedes the voltage breakdown path between the bases of the first and second transistors. The differential circuit is particularly useful in an improved compact magnetic media system wherein both the stored signal and the write signal or voltage are applied to the bases of the first and second transistor of the circuit without the high write voltages destroying the high performance first and second transistors.

6 Claims, 2 Drawing Figures

DIFFERENTIAL CIRCUIT HAVING A HIGH VOLTAGE SWITCH

This application is a division of application Ser. No. 332,403, filed Dec. 21, 1981, now U.S. Pat. No. 4,477,846.

DESCRIPTION

1. Technical Field

This invention relates to a differential circuit responsive to small signals and having high gain which, is suitable for use in integrated circuits, particularly for sensing signals from a very small magnetic spot on a rotating magnetic media having high storage density.

2. Background Art

Various amplifiers have been used in an attempt to satisfy the many requirements imposed by different environments. One type of amplifier used in integrated circuit form is a differential amplifier as disclosed in IBM Technical Disclosure Bulletin, Vol. 13, No. 2, July 1970, pp. 484–485, by K. G. Tertel, which employs a constant current source connected to one end of two parallel circuits, with a common voltage source connected at the other end of the parallel circuit. A first pair of bipolar transistors, one transistor being located in each of the parallel circuits, has a common emitter connection to the constant current source with a pair of loads connected to the common voltage source. Small complementary signals may be applied to the bases of the transistors with the output being taken at the collectors thereof. Other differential amplifier circuits sensitive to small signals are described in commonly assigned U.S. Pat. No. 3,685,025, filed June 25, 1970, by R. W. Bryant and G. K. Tu and in U.S. Pat. No. 4,099,266, filed Feb. 25, 1977, by C. Biggers.

While these amplifiers are capable of sensing very small complementary signals, the application of large signals, such as write signals, to their inputs tends to severely damage the amplifier transistors, while limiting the amplitude of the large write signal.

DISCLOSURE OF THE INVENTION

It is an object of this invention to provide an improved high performance amplifier circuit which is capable of amplifying very small input signals while readily tolerating large input signals or voltages.

It is another object of this invention to provide an improved amplifier circuit that does not limit the write signal amplitude.

It is still another object of this invention to provide an improved differential circuit which is capable of handling very low level signals at high band-width interspersed with large write voltages.

It is yet another object of this invention to provide an improved magnetic media system having high performance and storage density and improved reliability, with a low noise, high gain amplifier.

It is a further object of this invention to provide an improved magnetic media system having an amplifier circuit which is capable of sensing very small input signals during a first period of time and withstanding large write signals during a second period of time.

In accordance with the teachings of this invention, a differential circuit is provided having first and second transistors interconnected by a third transistor which is symmetrically constructed. A current source is selectively connected to the base of the third transistor. When the current source is connected to the base of the third transistor, the third transistor is saturated forming a very low impedance path between the first and second transistors. However, when the current source is disconnected from the base of the third transistor, the third transistor impedes the voltage breakdown path between the bases of the first and second transistors. In one embodiment of the amplifier circuit, the first and second transistors are of the NPN type and the third transistor is of the lateral PNP type. The differential circuit is particularly useful in an improved compact magnetic media system wherein both the stored signal and the write signal or voltage are applied to the bases of the first and second transistors.

The foregoing and other objects, features and advantages of the invention will be apparent from the following more particular description of the preferred embodiments of the invention, as illustrated in the accompanying drawings.

BEST MODE FOR CARRYING OUT THE INVENTION

Figure 1:
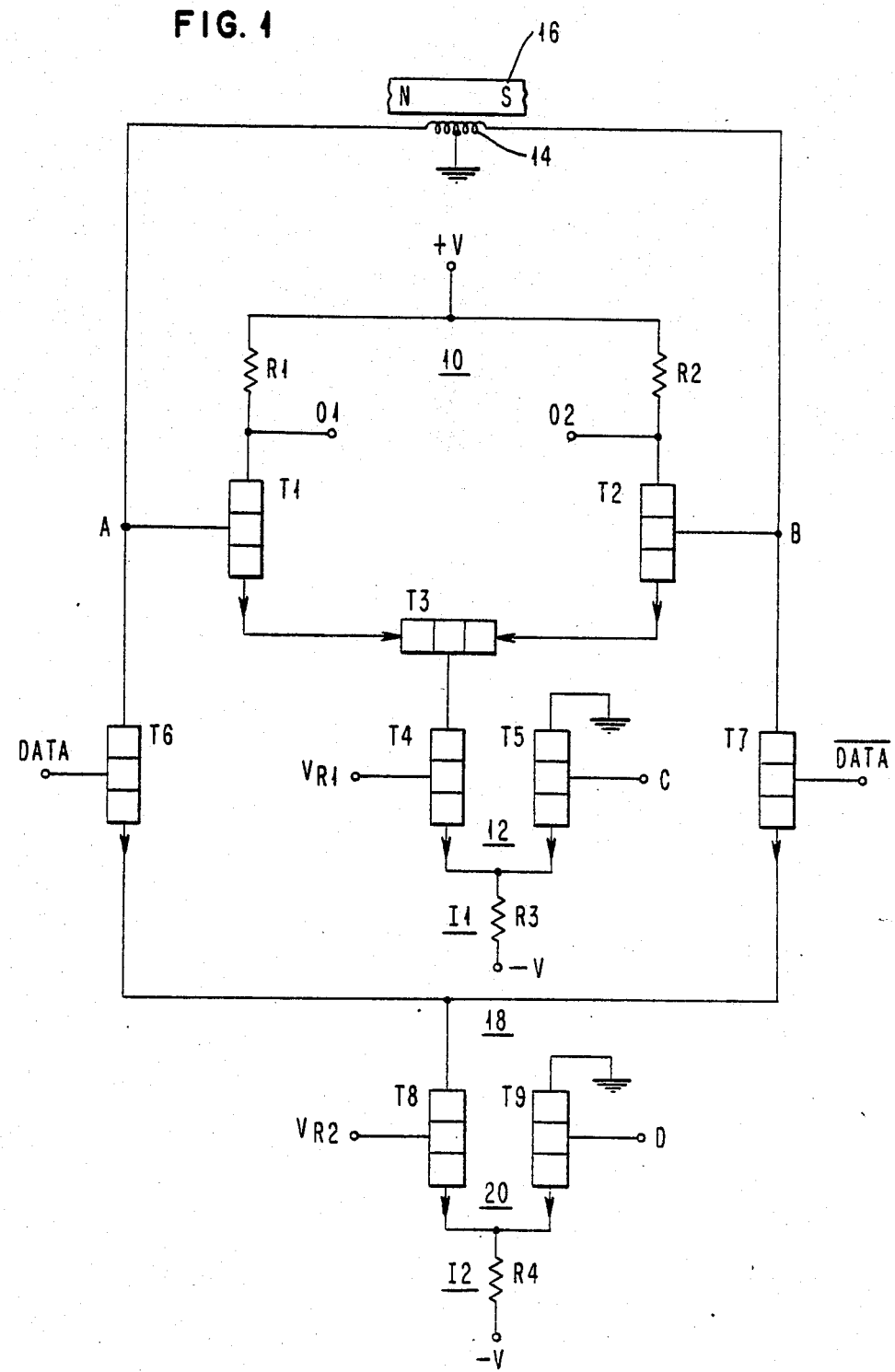
FIG. 1 is a circuit diagram of the magnetic media system including the amplifier circuit of the present invention.

Referring to FIG. 1 of the drawings in more detail, there is illustrated a magnetic media system which includes an amplifier circuit 10 of the present invention. The amplifier circuit 10 has first and second transistors T1 and T2 of the NPN type and a third transistor T3 of the PNP type interposed between the emitters of the transistors T1 and T2. First and second load resistors R1 and R2, each of which may be 1K ohms, are connected between the collectors of the first and second transistors T1 and T2 and a common voltage source terminal +V, which may be at +12 volts. A first current source I1, which includes a third resistor R3, of, e.g., 1200 ohms, and a negative voltage source indicated at terminal −V, which may be at −12 volts, is coupled to the base of the PNP transistor T3 through a first current switch 12 having fourth and fifth transistors T4 and T5 of the NPN type. The emitter of the transistor T4 is connected to the resistor R3 and its collector is connected to the base of the PNP transistor T3, with the base of transistor T4 being connected to a first voltage reference terminal $V_{R1}$, which may have a voltage of, e.g., −6 volts, applied thereto. The transistor T5 has its emitter connected to the resistor R3, its collector connected to a point of reference potential, such as ground, and its base connected to a read pulse terminal C. A coil 14 used as a read/write head, magnetically coupled to a magnetic spot of a rotating magnetic media 16, is connected between the bases of the first and second transistors T1 and T2 at nodes A and B. The output from the amplifier circuit 10 is taken from the collectors of the first and second transistors T1 and T2 at output terminals 01 and 02.

A write circuit 18 includes write data current switch transistors T6 and T7, with the base of transistor T6 connected to an input terminal DATA and the base of transistor T7 connected to an input terminal $\overline{\text{DATA}}$. The collectors of the transistors T6 and T7 are connected to the bases of the first and second transistors T1 and T2 and to the ends of the read/write head coil 14. A second current source I2, which includes a fourth resistor R4, of, e.g., 50 ohms, and the negative voltage source −V, is coupled to the emitters of the transistors T6 and T7 through a second current switch 20 having eighth and ninth transistors T8 and T9 of the NPN type. The emitter of the transistor T8 is connected to the resistor R4 and its collector is connected to the emitters of the transistors T6 and T7, with the base of transistor T8 connected to a second voltage reference terminal $V_{R2}$, which also may have a voltage of, e.g., −6 volts applied thereto. The transistor T9 has its emitter connected to the resistor R4, its collector connected to the point of reference potential and its base connected to a write pulse terminal D.

Figure 2:
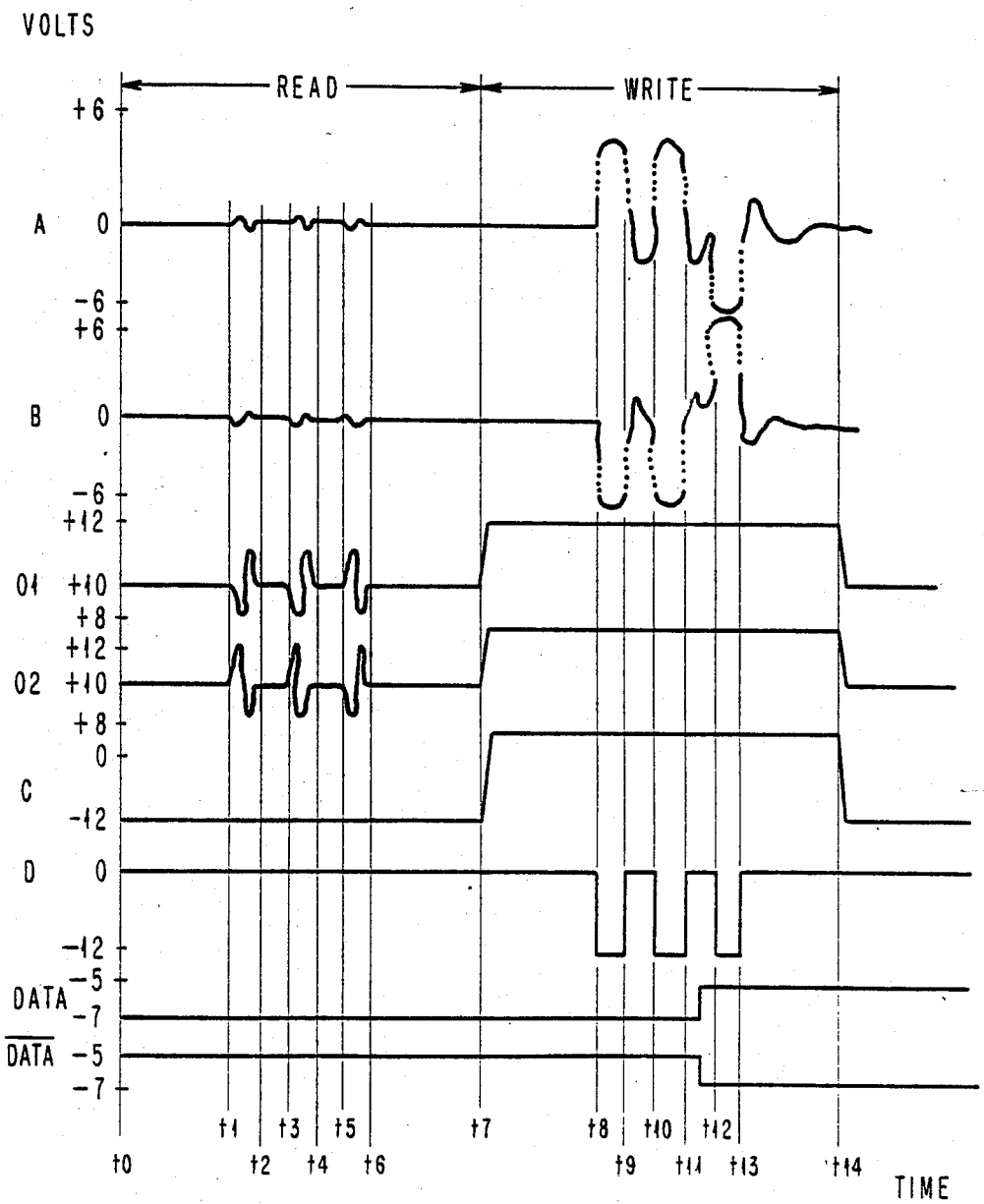
FIG. 2 is a pulse program which may be used to operate the system of the invention illustrated in FIG. 1 of the drawings.

In order to better understand the operation of the system illustrated in FIG. 1 of the drawings, reference may be had to the pulse program indicated in FIG. 2 of the drawings. At time t0, initiating a read portion of an accessing cycle, with terminal C of the first current switch 12 at −12 volts, the transistor T5 is turned off and the transistor T4 is turned on, reducing the voltage at output terminals 01 and 02 from +12 volts to approximately +10 volts, as indicated in FIG. 2 of the drawings at curves C, 01 and 02. Since the voltage at terminal D of the second current switch 20 is at 0 volts and the voltage at $V_{R2}$ is at −6 volts, the voltage at nodes A and B is zero. At time t1, coil 14 picks up a signal from rotating or moving magnetic media 16 which produces initially a small positive voltage excursion of a few microvolts at node A and a negative voltage excursion of a few microvolts at node B, as indicated in FIG. 2 at curves A and B, respectively, and amplified voltage signals at output terminal 01 and 02, as indicated in FIG. 2 at curves 01 and 02, which terminate at time t2. Between times t3 and t4 signals are produced which are similar to those produced between times t1 and t2. These signals may be considered to indicate the presence of a "1" digit of binary information stored in the magnetic media 16. Between times t5 and t6, the polarity of the signals at nodes A and B and at the output terminals 01 and 02 is reversed with respect to that of the signals produced between times t1 and t2 and t3 and t4, indicating the detection of a "0" digit of binary information.

At time t7, a write portion of the accessing cycle is initiated by raising the voltage at terminal C to zero volts, as indicated in FIG. 2 at curve C, to turn off transistor T4 and to turn on transistor T5. To write a "1" digit of binary information into the magnetic media 16, between times t8 and t9, the voltage at the terminal D of the second current switch 20 is lowered from zero volts to −12 volts, turning off transistor T9 and turning on transistor T8, while the voltages at the terminals DATA and $\overline{\text{DATA}}$ remain at −7 volts and −5 volts, respectively, producing a positive voltage excursion of about +6 volts at node A and a negative voltage excursion of about −6 volts at node B. This voltage differential between nodes A and B produces a current in the coil 14 which forms the desired magnetic orientation in the magnetic media 16. As indicated in curve D of FIG. 2, another "1" digit of binary information is stored in the magnetic media 16 between times t10 and t11 by again reducing the voltage at the terminal D to zero volts. In order to store a "0" digit of binary information in the magnetic media 16, the voltage at the terminal DATA is raised to −5 volts and the voltage at the terminal $\overline{\text{DATA}}$ is lowered to −7 volts, with the voltage at terminal D being lowered again to −12 volts, as indicated in FIG. 2 of the drawings between times t12 and t13. The voltages applied to terminals D, DATA and $\overline{\text{DATA}}$, produce a negative voltage at node A and a positive voltage at node B, causing current reversal in the coil 14 to form a magnetic orientation in the magnetic media 16 indicating the storage of the "0" digit. At time t14, the voltage at the terminal C may again be reduced to −12 volts to read the newly stored information from the magnetic media 16 in the manner described hereinabove between times t0 and t7 in the curves of FIG. 2.

It should be noted that when the voltage on the terminal C is low during a reading operation, and the voltage on terminal D is high, the PNP transistor T3 is saturated since both PN junctions of the PNP transistor are foward biased, forming a very low impedance broad bandwidth path between the emitters of the transistors T1 and T2. This impedance is significantly lower than that of two diodes, although two balanced diodes may be used, if desired, by arranging one of the diodes between the emitter of the transistor T1 and the collector of transistor T4 and the other diode between the emitter of the transistor T2 and the collector of the transistor T4. With the emitter-base and collector-base junctions of a PNP transistor located within a few microns of each other, true transistor action is achieved with a resulting low impedance. If these junctions are spaced apart by more than a few microns, they essentially form two diodes, resulting in a higher impedance between the emitters of the transistors T1 and T2.

Since in most instances the low impedance is preferred, a symmetrical PNP transistor is fabricated for the transistor T3. A symmetrical lateral transistor may be produced of the type described, e.g., in IBM Technical Disclosure Bulletin Vol. 17, No. 9, February, 1975, by B. C. Atwood on page 2574, having interdigitated finger-like diffusions forming an emitter and a collector in a substrate acting as the base of the transistor. If desired, a PNP lateral transistor which may have even more gain can be fabricated by forming P-type diffusion squares in a lightly doped N type base material and interconnecting alternate squares as an emitter, with the remaining squares being interconnected to form the collector. Of course, it should be understood that the emitter and collector reverse their roles and act as the collector and emitter, respectively, depending upon the voltages applied to nodes A and B of the system in FIG. 1 of the drawings. When such a symmetrical lateral PNP transistor is used, the noise figure and the bandwidth are now principally dependent on the two high performance NPN transistors T1 and T2, with the only compromise involving the choice of a bias point for optimum operation.

When the voltage on the terminal C is raised to zero volts for a write operation, and the voltage on terminal D is lowered to −12 volts, the first current source I1 is disconnected the base of the PNP transistor T3 causing the lateral PNP transistor T3 to impede the voltage breakdown path between the bases of the first and second NPN transistors T1 and T2 which protects the transistors T1 and T2 from the high write voltages being applied to the coil 14 through the nodes A and B.

It should be understood that if this high voltage breakdown path between the emitters of the transistors T1 and T2 were not provided, the high write voltage would degrade or destroy high performance transistors T1 and T2. As these NPN transistors are typically fabricated, the collector-base breakdown is generally 25 or more volts due to the use of relatively lightly doped diffusion regions with a gradual diffusion profile. However, the emitter and base regions at their junction are heavily doped, with the profile of the emitter being particularly sharp. Thus, the breakdown voltage of the emitter-base junction is considerably lower than that of the collector-base junction. Generally this emitter-base junction is designed to have a 5 to 7 volt breakdown. Transistor T3 provides collector-emitter breakdown that is higher than the emitter-base breakdown voltage of either transistor T1 or T2 because these junctions are formed in a like manner as the collector-base junctions of transistors T1 and T2.

Although the transistors T1 and T2 have been illustrated as being of the NPN type and the transistor T3 has been identified as being of the PNP type, it should be understood that, if desired, the transistors T1 and T2 may be of the PNP type and the transistor T3 may be of the NPN type.

It can be seen that an improved high density magnetic media system of the direct access storage device type has been provided in accordance with the teachings of this invention which has a simple sensitive amplifier and a write circuit connected to the read/write head or coil 14, wherein the amplifier is protected from the high voltages of the write circuit by positioning a bilateral switch of, preferably, the symmetrical PNP transistor type between the input transistors of the amplifier.

While the invention has been particularly shown and described with reference to preferred embodiments thereof, it will be understood by those skilled in the art that various changes in form and details may be made therein without departing from the spirit and scope of the invention.

What is claimed is:

1. A semiconductor circuit comprising;

first, second, third, fourth, fifth and sixth serially arranged PN junctions, said first and second junctions, said third and fourth junctions each respectively forming first and second transistors of one conductivity type and said fifth and sixth junctions spaced sufficiently close so as to form a symmetrical lateral transistor of a second conductivity type between said first and second transistors, an electrode disposed between said fifth and sixth junctions, means including a current source for selectively applying an electrical bias to said electrode, means for applying signals to said first and second junctions and to said third and fourth junctions, and load means including output terminals connected to said first and third junctions.

2. A semiconductor circuit as set forth in claim 1 wherein said symmetrical transistor comprises a bilateral PNP transistor including said fifth and sixth junctions.

3. A semiconductor circuit as set forth in claim 1 wherein said fifth and sixth junctions are disposed within a few microns of each other.

4. A semiconductor circuit as set forth in claim 1 wherein said fifth and sixth junctions are positioned as mirror images with respect to each other.

5. A semiconductor circuit as set forth in claim 4 wherein said first and second junctions form a first NPN transistor, said third and fourth junctions form a second NPN transistor and said fifth and sixth junctions form a PNP transistor.

6. A semiconductor circuit as set forth in claim 5 wherein said electrical bias applying means includes a third NPN transistor having a collector connected to said electrode.

* * * * *